(12) United States Patent
Williams

(10) Patent No.: US 7,362,137 B2
(45) Date of Patent: Apr. 22, 2008

(54) HIGH SPEED VOLTAGE LEVEL SHIFTER CIRCUITS

(75) Inventor: Devon Glenford Williams, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 11/459,381

(22) Filed: Jul. 24, 2006

(65) Prior Publication Data

US 2008/0018360 A1    Jan. 24, 2008

(51) Int. Cl.
*H03K 19/0175*    (2006.01)
(52) U.S. Cl. .............................. 326/81; 326/68; 326/83
(58) Field of Classification Search .................. 326/21, 326/30, 62–63, 68, 81–83; 327/333
See application file for complete search history.

(56) References Cited

U.S. PATENT DOCUMENTS 6,838,905 B1 * 1/2005 Doyle .......................... 326/81
7,102,389 B2 * 9/2006 Chen et al. .................... 326/81
7,129,751 B2 * 10/2006 Jahan et al. ................... 326/68
7,176,740 B2 * 2/2007 Tachibana et al. ........... 327/333
7,274,209 B1 * 9/2007 Reinschmidt ................ 326/38

* cited by examiner

*Primary Examiner*—Rexford Barne
*Assistant Examiner*—Christopher Lo
(74) *Attorney, Agent, or Firm*—Joan Pennington

(57) ABSTRACT

A level shifter circuit for shifting a voltage level of a logic signal from a first voltage to a second voltage includes an input stage operating in a domain of a first voltage supply that receives an input signal. The input stage includes a first inverter receiving the input signal and providing a first inverted signal. An output voltage level shifting stage operating in a domain of a second voltage supply is coupled to the input stage and providing an output signal having a voltage level corresponding to the second voltage supply domain and a logic value corresponding to the input signal. The level shifter circuit enables voltage level shifting a logic signal from a high to a low operating voltage, or from a low to a high operating voltage. The level shifter circuit enables high frequency operation, providing both fast switching and low capacitance.

14 Claims, 4 Drawing Sheets

HIGH SPEED VOLTAGE LEVEL SHIFTER CIRCUITS

FIELD OF THE INVENTION

The present invention relates generally to the field of integrated circuits, and more particularly, relates to level shifter circuits for shifting a voltage level of a logic signal from a first voltage to a second voltage.

DESCRIPTION OF THE RELATED ART

Level shifter circuits are utilized in integrated circuits for changing the voltage of a signal from a first voltage to a second voltage, such as from a high to a low operating voltage, or from a low to a high operating voltage. A need exists for efficient and effective level shifter circuits. It is desirable to provide such level shifter circuits that enable shifting a voltage level of a logic signal from a high to a low operating voltage, or from a low to a high operating voltage.

It is desirable to provide such level shifter circuits that enable operation between at least two different voltage domains. It is desirable to provide such level shifter circuits that enable high frequency operation.

It is desirable to provide such level shifter circuits that enable fast switching and low capacitance.

SUMMARY OF THE INVENTION

Principal aspects of the present invention are to provide enhanced level shifter circuits for shifting a voltage level of a logic signal from a first voltage to a second voltage. Other important aspects of the present invention are to provide such level shifter circuits for shifting a voltage level of a logic signal from a first voltage to a second voltage substantially without negative effect and that overcome some disadvantages of prior art arrangements.

In brief, a level shifter circuit is provided for shifting a voltage level of a logic signal from a first voltage to a second voltage. An input stage operating in a domain of a first voltage supply receives an input signal. The input stage includes a first inverter receiving the input signal and providing a first inverted signal. The input stage includes an output voltage level shifting stage operating in a domain of a second voltage supply that is coupled to the input stage and providing an output signal having a voltage level corresponding to the second voltage supply and a logic value corresponding to the input signal.

In accordance with features of the invention, the level shifter circuit enables shifting a voltage level of a logic signal from a high to a low operating voltage, or from a low to a high operating voltage. The level shifter circuit enables high frequency operation, for example, in a selected GHz frequency range providing both fast switching and low capacitance.

In accordance with features of the invention, the input stage of the level shifter circuit includes a second inverter receiving an inverted input signal and providing a second inverted signal. The input stage includes a first transistor coupled between the first voltage supply and the first inverter receives a control input of the second inverted signal. The input stage includes a second transistor coupled between the first voltage supply and the second inverter receiving a control input of the first inverted signal. The second inverted signal is applied to a first inverter of the output voltage level shifting stage. The first inverter of the output voltage level shifting stage is coupled between the second voltage supply and ground. A series connected P-channel field effect transistor (PFET) and an N-channel field effect transistor (NFET) of the output voltage level shifting stage is connected between the second voltage supply VDD and ground. The first inverted signal provides an output of the output voltage level shifting stage and a gate signal to the PFET of the output voltage level shifting stage. An output of the first inverter of the output voltage level shifting stage provides a gate signal to the NFET of the output voltage level shifting stage.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features and other advantages of the preferred embodiments, enhanced level shifter circuits for shifting a voltage level of a logic signal from a first voltage to a second voltage. The level shifter circuits enables shifting a voltage level of a logic signal from a high to a low operating voltage, or from a low to a high operating voltage. The level shifters enable high frequency operation, for example, in a selected GHz frequency range providing fast switching and low capacitance. The level shifters produce a level shifted VDD value with a logic value identical to the input signal, while also maintaining the capability of producing an output identical, but inverted from the input signal. The level shifter includes transistors for cutting off the flow of current between power supply domains when the input terminals are at a particular state.

Figure 1:
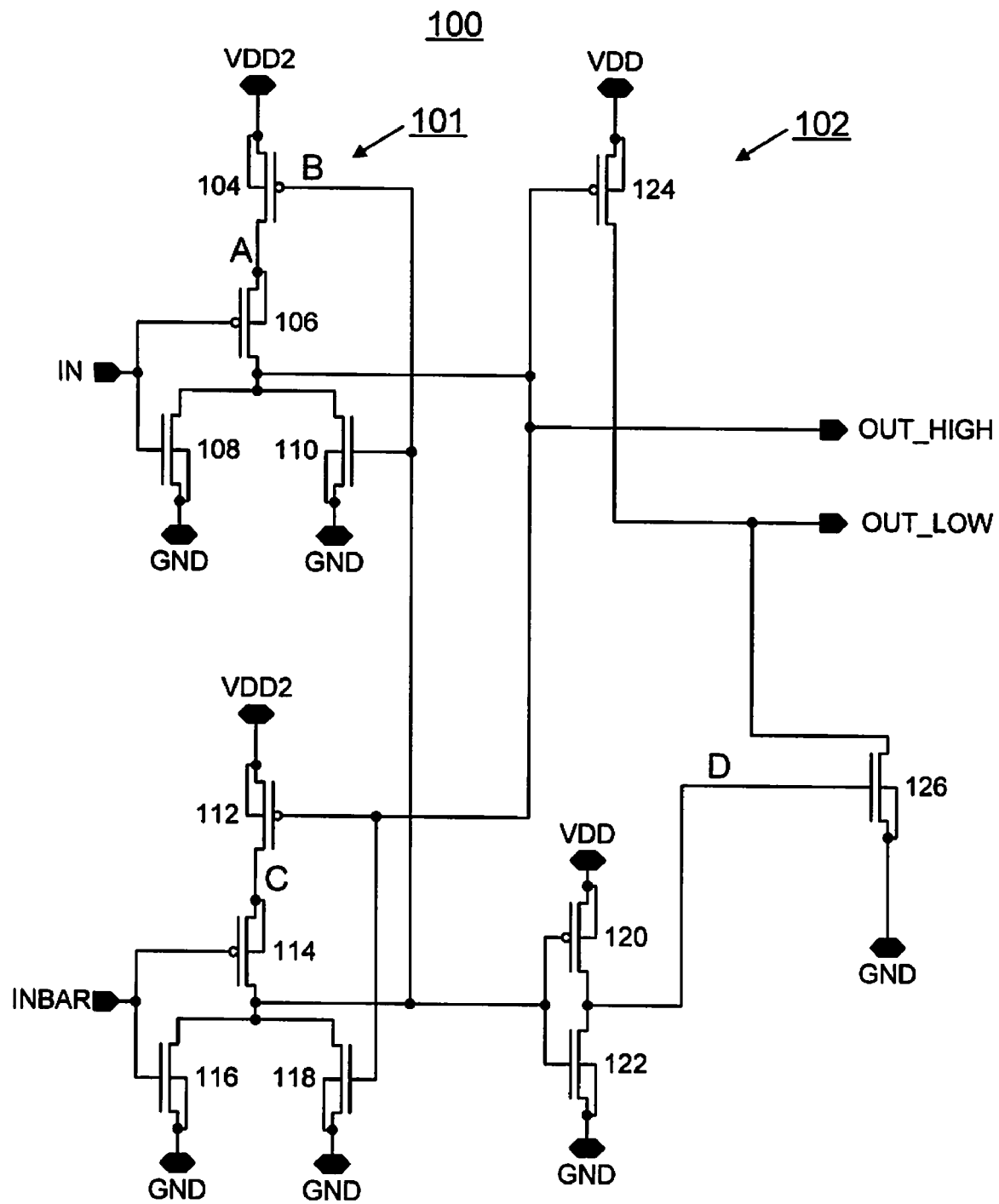
FIG. 1 is a schematic diagram illustrating a first exemplary level shifter circuit in accordance with the preferred embodiment.

Having reference now to the drawings, in FIG. 1, there is shown an exemplary level shifter circuit generally designated by the reference character 100 in accordance with the preferred embodiment. Level shifter circuit 100 is provided for shifting a voltage level of a logic signal from a first voltage to a second voltage. Level shifter circuit 100 enables high frequency operation, for example, of 1 GHz frequency.

Level shifter circuit 100 includes an input stage generally designated by the reference character 101 operating in a domain of a first voltage supply VDD2 receiving an input signal at an input labeled IN and an inverted input signal at an input labeled INBAR. Level shifter circuit 100 includes an output voltage level shifting stage generally designated by the reference character 102 operating in a domain of a second voltage supply VDD. Output voltage level shifting stage 102 is coupled to the input stage 101 receiving a first inverted signal indicated at a node OUT_HIGH and also providing an output signal indicated at a node OUT_LOW. The output signal OUT_LOW has a voltage level shifted value corresponding to the second voltage supply VDD and a logic value corresponding to the input signal IN.

In accordance with features and other advantages of the preferred embodiments, the first voltage supply VDD2 optionally has a voltage level higher than or lower than the second voltage supply VDD.

With the first voltage supply VDD2 having a voltage level higher than the second voltage supply VDD, level shifter circuit 100 functions as a high-to-low level shifter, shifting a voltage level of a logic signal from a high voltage to a low voltage.

With the first voltage supply VDD2 having a voltage level lower than the second voltage supply VDD, level shifter circuit 100 functions as a low-to-high level shifter, shifting a voltage level of a logic signal from a low voltage to a high voltage.

Input stage 101 includes a pair of series connected P-channel field effect transistors (PFETs) 104, 106 connected in series with a pair of parallel connected N-channel field effect transistors (NFETs) 108, 110. PFETs 104, 106 and NFETs 108, 110 are between the first voltage supply VDD2 and ground. A first inverter defined by PFET 106 and NFET 108 receives the input signal IN and provides a first inverted signal at a first node or net labeled OUT_HIGH. A node or net labeled A is indicated at the drain source connection of PFETs 104, 106.

Input stage 101 includes a pair of series connected PFETs 112, 114 connected in series with a pair of parallel connected NFETs 116, 118. PFETs 112, 114 and NFETs 116, 118 are connected between the first voltage supply VDD2 and ground. A second inverter defined by PFET 114 and NFET 116 receives the inverted input signal INBAR and providing a second inverted signal at a node or net labeled B.

Output voltage level shifting stage 102 includes a first inverter defined by a series connected PFET 120 and an NFET 122 connected between the second voltage supply VDD and ground. A second series connected PFET 124 and an NFET 126 is connected between the second voltage supply VDD. The second inverted signal at net B is applied to the gate connection of the output stage inverter PFET 120 and NFET 122. The first inverted signal at net OUT_HIGH is applied to the gate of PFET 124, and the inverted output of output stage inverter PFET 120 and NFET 122 is applied to the gate of NFET 126.

Operation of the level shifter circuit 100 may be further understood as follows. With a high or one level signal on the input IN and a low or zero level signal on the input INBAR, net A being the drain of PFET 104 is pulling high compliment of the source connected to the first power supply VDD2. Net B output of inverter PFET 114 and NFET 116 gates PFET 104, NFET 110, PFET 112, and NFET 122 pulling in the direction of the input signal IN, while connected to the drains of NFETs 116, 118 and PFET 114. The input signal IN is applied to the gates of inverter PFET 106 and NFET 108 that inverts the input signal, and maintains a high level at output net OUT_HIGH as dictated by the power supply VDD2 on source of PFET 104.

This inverted signal at output net OUT_HIGH is maintained by being tied to the gates of PFETs 124, 112 and NFET 118. Net C provides drain-source connection for PFETs 112, 114 respectively, following in the direction of the inverted input signal INBAR. The inverted input signal INBAR is applied to the second inverter PFET 114, NFET 116 and is inverted as identified by net B and then shifted down to the target VDD by the output stage inverter PFET 120, NFET 122. The level shifter signal is now held low and maintained by NFET 126. PFETs 120, 124, NFETs 122 and 126 together shift this signal to the shifted voltage level.

Figure 2:
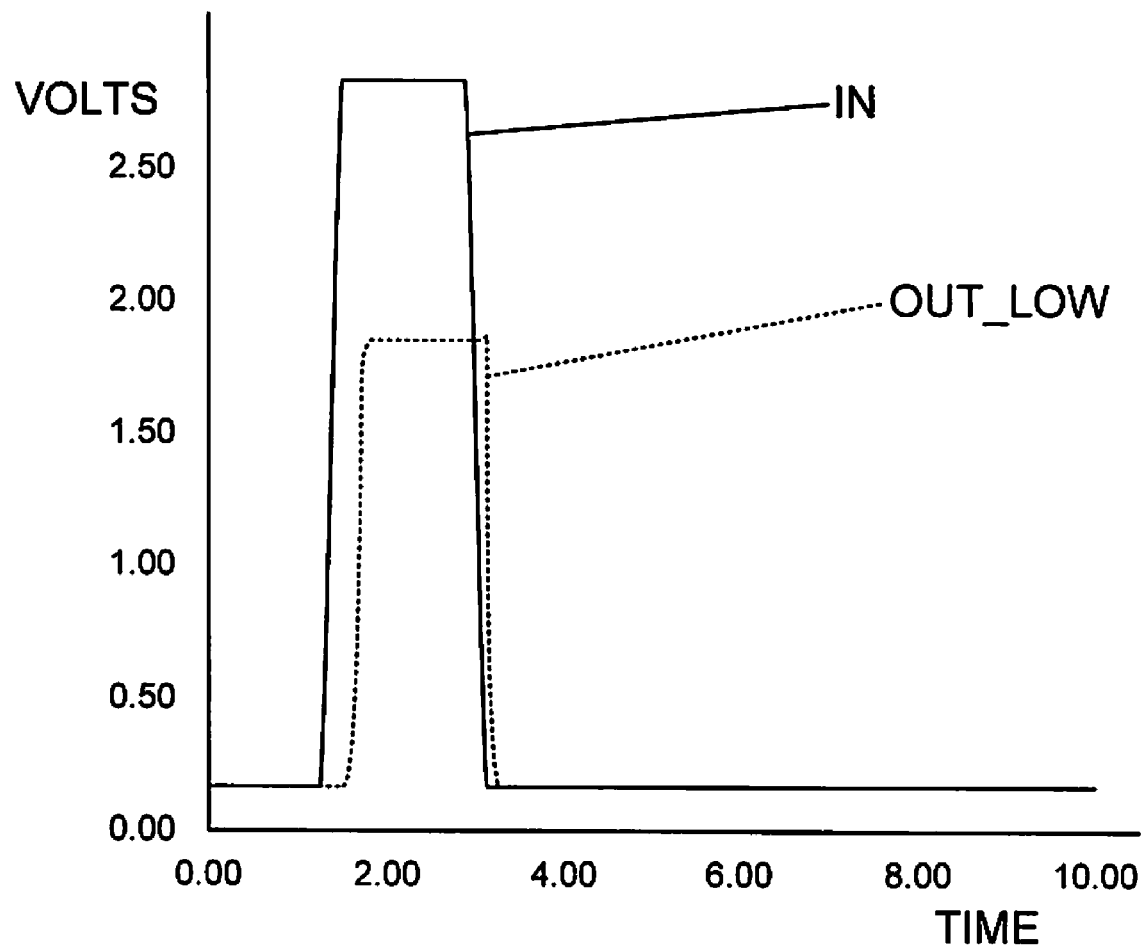
FIG. 2 is a graph illustrating exemplary operation of the first exemplary level shifter circuit of FIG. 1 in accordance with the preferred embodiment.

FIG. 2 illustrates exemplary operation of the level shifter circuit 100 in accordance with the preferred embodiment, where the first voltage supply level VDD2 in this case is 2.7V and is shifted down to the second voltage supply level VDD which is 1.3V. In FIG. 2, time is shown in nanoseconds along the horizontal axis and voltage is shown along the vertical axis in volts (V). An exemplary input signal is indicated by IN and an exemplary output signal at node OUT-LOW is indicated by OUT-LOW.

Figure 3:
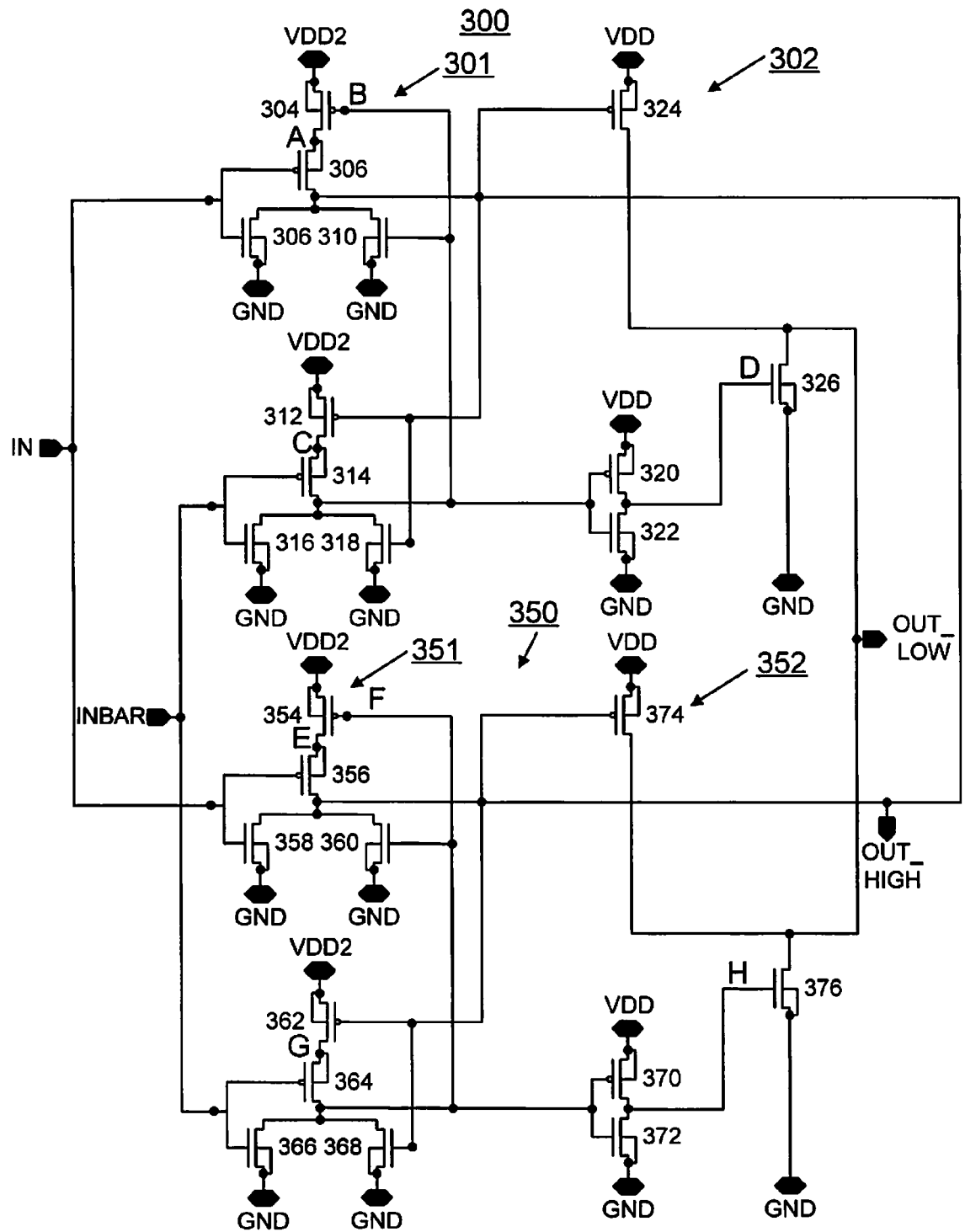
FIG. 3 is a schematic diagram illustrating a second exemplary level shifter circuit in accordance with the preferred embodiment.

Referring now to FIG. 3, there is shown another exemplary level shifter circuit generally designated by the reference character 300 in accordance with the preferred embodiment. Level shifter circuit 300 is provided for shifting a voltage level of a logic signal from a first voltage to a second voltage, and is arranged for providing high frequency operation. Level shifter circuit 300 enables high frequency operation, for example, of 1.5 GHz frequency, higher than level shifter 100 while level shifter circuit 100 has the advantage of requiring fewer components.

Level shifter circuit 300 includes a first input stage generally designated by the reference character 301 operating in a domain of a first voltage supply VDD2 receiving an input signal at an input labeled IN and an inverted input signal at an input labeled INBAR. Level shifter circuit 300 includes a first output voltage level shifting stage generally designated by the reference character 302 operating in a domain of a second voltage supply VDD. Output voltage level shifting stage 302 is coupled to the input stage 301 receiving a first inverted signal indicated at a node OUT_HIGH and also providing an output signal indicated at a node OUT_LOW. The output signal OUT_LOW has a voltage level shifted value corresponding to the second voltage supply VDD and a logic value corresponding to the input signal IN.

In accordance with features and other advantages of the preferred embodiments, the first voltage supply VDD2 optionally has a voltage level higher than or lower than the second voltage supply VDD. With the first voltage supply VDD2 having a voltage level higher than the second voltage supply VDD, level shifter circuit 300 functions as a high-to-low level shifter, shifting a voltage level of a logic signal from a high voltage to a low voltage. With the first voltage supply VDD2 having a voltage level lower than the second voltage supply VDD, level shifter circuit 300 functions as a low-to-high level shifter, shifting a voltage level of a logic signal from a low voltage to a high voltage.

Input stage 301 includes a pair of series connected PFETs 304, 306 connected in series with a pair of parallel connected NFETs 308, 310.

PFETs 304, 306 and NFETs 308, 310 are between the first voltage supply VDD2 and ground. A first inverter defined by PFET 306 and NFET 308 receives the input signal IN and provides a first inverted signal at a first node or net labeled OUT_HIGH. A node or net labeled A is indicated at the drain source connection of PFETs 304, 306.

Input stage 301 includes a second pair of series connected PFETs 312, 314 connected in series with a second pair of parallel connected NFETs 316, 318. PFETs 312, 314 and NFETs 316, 318 are connected between the first voltage supply VDD2 and ground. A second inverter defined by PFET 314 and NFET 316 receives the inverted input signal INBAR and providing a second inverted signal at a node or net labeled B.

Output voltage level shifting stage 302 includes a first inverter defined by a series connected PFET 320 and an NFET 322 connected between the second voltage supply VDD and ground. A second series connected PFET 324 and an NFET 326 is connected between the second voltage supply VDD. The second inverted signal at net B is applied to the gate connection of the output stage inverter PFET 320 and NFET 322. The first inverted signal at net OUT_HIGH is applied to the gate of PFET 324, and the inverted output of output stage inverter PFET 320 and NFET 322 is applied to the gate of NFET 326.

Level shifter circuit 300 includes a coupled network generally designated by the reference character 350 including a coupled network input stage generally designated by the reference character 351 operating in a domain of the first voltage supply VDD2 receiving an input signal at an input labeled IN and an inverted input signal at an input labeled INBAR. Coupled network 350 of level shifter circuit 300 includes a coupled network output voltage level shifting stage generally designated by the reference character 352 operating in the domain of a second voltage supply VDD.

Coupled network output voltage level shifting stage 352 is coupled to the coupled network input stage 351 receiving a first inverted signal indicated at node OUT_HIGH and also providing an output signal indicated at the node OUT_LOW.

Coupled network input stage 351 includes a pair of series connected PFETs 354, 356 connected in series with a pair of parallel connected NFETs 358, 360. PFETs 354, 356 and NFETs 358, 360 are between the first voltage supply VDD2 and ground. A first coupled network inverter defined by PFET 356 and NFET 358 receives the input signal IN and provides a first inverted signal at a first node or net labeled OUT_HIGH. A node or net labeled E is indicated at the drain source connection of PFETs 354, 356.

Coupled network input stage 351 includes a second pair of series connected PFETs 362, 364 connected in series with a second pair of parallel connected NFETs 366, 368. PFETs 362, 364 and NFETs 366, 368 are connected between the first voltage supply VDD2 and ground. A second inverter defined by PFET 364 and NFET 366 receives the inverted input signal INBAR and providing a second inverted signal at a node or net labeled F.

Coupled network output voltage level shifting stage 352 includes a first inverter defined by a series connected PFET 370 and an NFET 372 connected between the second voltage supply VDD and ground. A second series connected PFET 374 and an NFET 376 is connected between the second voltage supply VDD. The second inverted signal at net F is applied to the gate connection of the output stage inverter PFET 370 and NFET 372. The first inverted signal at net OUT_HIGH is applied to the gate of PFET 374, and the inverted output of output stage inverter PFET 370 and NFET 372 is applied to the gate of NFET 376.

Input stage 301 and first output voltage level shifting stage 302 of the level shifter circuit 300 generally are functionally identical to the coupled network input stage 351 and coupled network output voltage level shifting stage 352.

Operation of the level shifter circuit 300 may be further understood as follows. With a high or one level signal on the input IN and a low or zero level signal on the input INBAR, respective net A and net E being the drain of respective PFET 304, 354 is pulling high compliment of the respective source connected to the first power supply VDD2. Net B output of inverter PFET 314 and NFET 316 gates PFET 304, NFET 310, PFET 320, and NFET 322, pulling in the direction of the input signal IN, while connected to the drains of NFETs 316, 318 and PFET 314. Similarly net F output of inverter PFET 364 and NFET 366 gates PFET 354, NFET 360, PFET 370, and NFET 372, pulling in the direction of the input signal IN, while connected to the drains of NFETs 366, 368 and PFET 364. The input signal IN is applied to the gates of respective inverter PFET 306 and NFET 308, and inverter PFET 356 and NFET 358 each inverting the input signal, and maintaining a high level at output net OUT_HIGH as dictated by the power supply VDD2 on source of PFET 304, 354.

This inverted signal at output net OUT_HIGH is maintained by being tied to the gates of PFETs 324, 312 and NFET 318, and PFETs 374, 362 and NFET 368. Respective net C, net G provides respective drain source connection for PFETs 312, 314 and PFETs 362, 364 respectively, following in the direction of the inverted input signal INBAR. The inverted input signal INBAR is applied to the respective second inverter PFET 314, NFET 316 and second inverter PFET 364, NFET 366 and is inverted as identified by respective net B, net F and then shifted down to the target VDD by the respective output stage inverter PFET 320, NFET 322, and coupled network output stage inverter PFET 370, NFET 372. The level shifter signal is now held low and maintained by respective NFET 326, NFET 376. PFETs 320, 324, NFETs 322 and 326, and coupled network PFETs 370, 374, NFETs 372 and 376 respectively shift this signal to the shifted voltage level.

Figure 4:
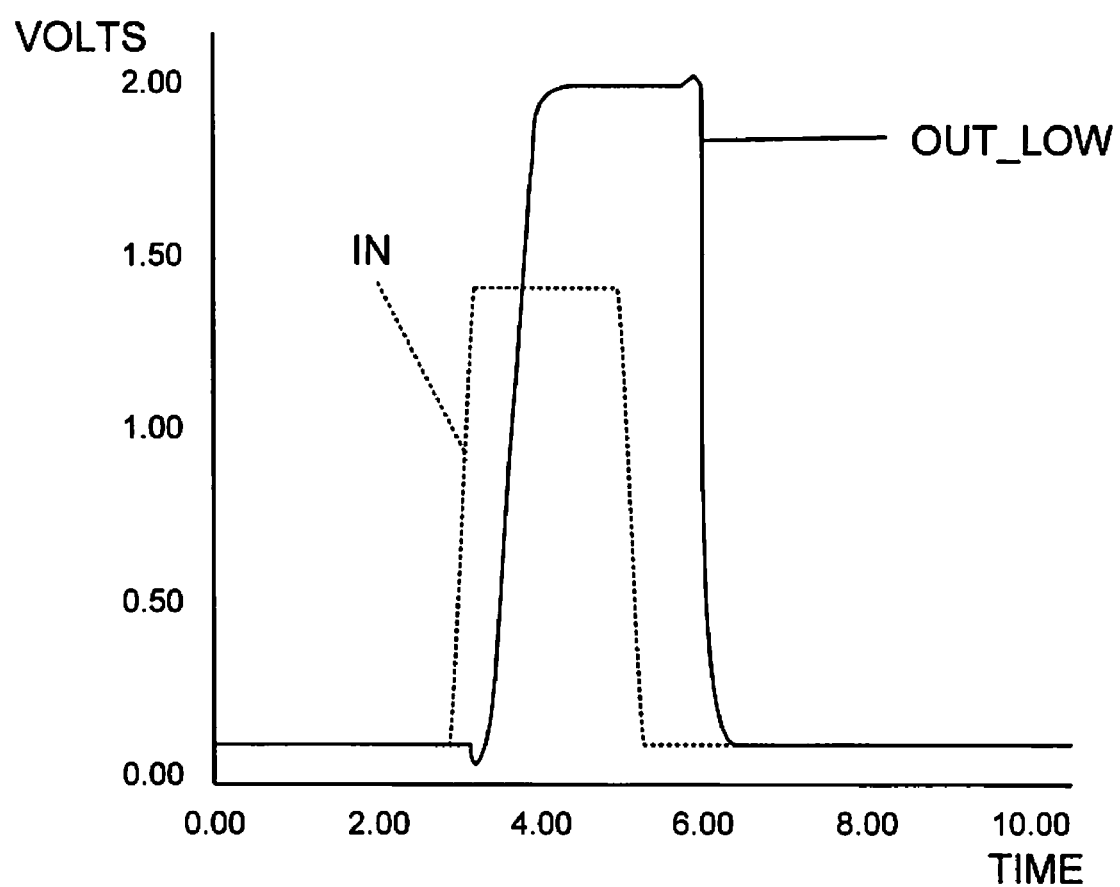
FIG. 4 is a graph illustrating operation of the second exemplary level shifter circuit of FIG. 3 in accordance with the preferred embodiment.

FIG. 4 illustrates exemplary operation of the level shifter circuit 300 in accordance with the preferred embodiment, where the first voltage supply level VDD2 in this case is 1.3V and is shifted up to the second voltage supply level VDD which is 1.95V. In FIG. 4, time is shown in nanoseconds along the horizontal axis and voltage is shown along the vertical axis in volts (V). An exemplary input signal is indicated by IN and an exemplary output signal of the level shifter circuit 300 at node OUT-LOW is indicated by OUT-LOW.

While the present invention has been described with reference to the details of the embodiments of the invention shown in the drawing, these details are not intended to limit the scope of the invention as claimed in the appended claims.

What is claimed is:

1. A voltage level shifter circuit for shifting a voltage level of a logic signal from a first voltage to a second voltage comprising:

an input stage operating in a domain of a first voltage supply receiving an input signal; said input stage including a first inverter receiving said input signal and providing a first inverted signal; said input stage including a second inverter receiving an inverted input signal and providing a second inverted signal; said input stage including a first transistor coupled between the first voltage supply and the first inverter, said first transistor receiving a control input of the second inverted signal; said input stage including a second transistor coupled between the first voltage supply and the second inverter, said second transistor receiving a control input of the first inverted signal and an output voltage level shifting stage coupled to the input stage, said output voltage level shifting stage operating in a domain of a second voltage supply, and providing an output signal having a voltage level corresponding to said second voltage supply and a logic value corresponding to said input signal; said output voltage level shifting stage including a first inverter, said first inverter of said output voltage level shifting stage being coupled between the second voltage supply and ground, and said second inverted signal being applied to said first inverter of said output voltage level shifting stage.

2. A voltage level shifter circuit as recited in claim 1 wherein said first voltage supply is a higher voltage than said second voltage supply.

3. A voltage level shifter circuit as recited in claim 1 wherein said first voltage supply is a lower voltage than said second voltage supply.

4. A voltage level shifter circuit as recited in claim 1 wherein said output voltage level shifting stage providing a second output signal having a voltage level corresponding to said first voltage supply and a logic value corresponding to said first inverted signal.

5. A voltage level shifter circuit as recited in claim 1 wherein said output voltage level shifting stage shifts a voltage level of said input signal from a high to a low operating voltage.

6. A voltage level shifter circuit as recited in claim 1 wherein said output voltage level shifting stage shifts a voltage level of said input signal from a low to a high operating voltage.

7. A voltage level shifter circuit as recited in claim 1 wherein said level shifter circuit enables high frequency operation in a selected GHz frequency range.

8. A voltage level shifter circuit as recited in claim 1 wherein said output voltage level shifting stage includes a series connected P-channel field effect transistor (PFET) and an N-channel field effect transistor (NFET) connected between said second voltage supply VDD and ground.

9. A voltage level shifter circuit as recited in claim 8 wherein said first inverted signal provides a gate signal to said PFET of said output voltage level shifting stage, and an output of said first inverter of said output voltage level shifting stage provides a gate signal to said NFET of said output voltage level shifting stage.

10. A voltage level shifter circuit as recited in claim 9 wherein each of said first inverter and second inverter of said input stage and said first inverter of said output voltage level shifting stage includes a series connected PFET and NFET, said series connected PFET and NFET having a common gate input.

11. A voltage level shifter circuit as recited in claim 1 further includes a coupled network, said coupled network is substantially functionally identical to said input stage and said output voltage level shifting stage.

12. A voltage level shifter circuit as recited in claim 11 wherein said coupled network includes a coupled network input stage operating in a domain of said first voltage supply receiving said input signal; said coupled network input stage including a first coupled network inverter receiving said input signal and providing said first inverted signal; and a coupled network output voltage level shifting stage coupled to said coupled network input stage, said coupled network output voltage level shifting stage operating in a domain of said second voltage supply, and providing said output signal having said voltage level corresponding to said second voltage supply and said logic value corresponding to said input signal.

13. A voltage level shifter circuit for shifting a voltage level of a logic signal from a first voltage to a second voltage comprising:

an input stage operating in a domain of a first voltage supply receiving an input signal; said input stage including a first inverter receiving said input signal and providing a first inverted signal, a second inverter receiving an inverted input signal and providing a second inverted signal; and an output voltage level shifting stage coupled to the input stage, said output voltage level shifting stage operating in a domain of a second voltage supply and providing an output signal having a voltage level corresponding to said second voltage supply and a logic value corresponding to said input signal; and said output voltage level shifting stage including a first inverter, said first inverter of said output voltage level shifting stage coupled between said second voltage supply and ground, and said second inverted signal is applied to said first inverter of said output voltage level shifting stage; said output voltage level shifting stage including a series connected P-channel field effect transistor (PFET) and an N-channel field effect transistor (NFET) connected between said second voltage supply VDD and ground; said first inverted signal providing a gate signal to said PFET of said output voltage level shifting stage, and an output of said first inverter of said output voltage level shifting stage providing a gate signal to said NFET of said output voltage level shifting stage.

14. A voltage level shifter circuit as recited in claim 13 further includes a coupled network, said coupled network being substantially functionally identical to said input stage and said output voltage level shifting stage.

\* \* \* \* \*